US011320485B1

(12) United States Patent
Garg et al.

(10) Patent No.: US 11,320,485 B1
(45) Date of Patent: May 3, 2022

(54) SCAN WRAPPER ARCHITECTURE FOR SYSTEM-ON-CHIP (71) Applicant: NXP USA, Inc., Austin, TX (US)

(72) Inventors: Akhil Garg, Nodia (IN); Sahil Jain, Ghaziabad (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/247,948

(22) Filed: Dec. 31, 2020

(51) Int. Cl.
*G01R 31/3177* (2006.01)
*G01R 31/3183* (2006.01)
*G01R 31/317* (2006.01)

(52) U.S. Cl.
CPC ... *G01R 31/3177* (2013.01); *G01R 31/31713* (2013.01); *G01R 31/31723* (2013.01); *G01R 31/318335* (2013.01)

(58) Field of Classification Search
CPC .......... G01R 31/3177; G01R 31/31713; G01R 31/31723; G01R 31/318335
USPC ........................................ 714/729, 726, 727
See application file for complete search history.

(56) References Cited

U.S. PATENT DOCUMENTS

| 7,380,181 | B2 | 5/2008 | Goel et al. | |
|---|---|---|---|---|
| 7,870,449 | B2 * | 1/2011 | Waayers | G01R 31/318555 714/727 |
| 7,913,131 | B2 | 3/2011 | McLaurin et al. | |
| 7,941,717 | B2 * | 5/2011 | Waayers | G01R 31/31919 714/727 |
| 7,941,719 | B2 * | 5/2011 | Waayers | G01R 31/318536 714/729 |
| 7,945,834 | B2 * | 5/2011 | Waayers | G01R 31/318563 714/729 |
| 7,979,764 | B2 | 7/2011 | Foutz et al. | |
| 8,438,437 | B2 * | 5/2013 | Jain | G01R 31/318547 714/726 |
| 8,533,548 | B2 * | 9/2013 | Kim | G01R 31/31723 714/731 |
| 8,977,920 | B2 * | 3/2015 | Whetsel | G01R 31/31723 714/729 |
| 9,568,551 | B1 * | 2/2017 | Kataria | G01R 31/31727 |
| 2003/0146777 | A1 * | 8/2003 | Nadeau-Dostie | G01R 31/3187 326/93 |

(Continued)

OTHER PUBLICATIONS

Jain et al., Multi-CoDec Configurations for Low Power and High Quality Scan Test, 2011, IEEE, pp. 370-375. (Year: 2011).*

(Continued)

*Primary Examiner* — John J Tabone, Jr.

(57) ABSTRACT

A system-on-chip (SoC) is disclosed. The SoC includes a set of input channels, a first partition including a set of output wrapper chains, a set of output channels, a second partition including a set of input wrapper chains, and an inter-partition circuit coupled between the first and second partitions. During an external test mode, the set of input channels receives input test data. The set of output wrapper chains receives and stores intermediate data that is generated based on the input test data. The inter-partition circuit receives the intermediate data from the set of output wrapper chains and generates test response data based on the intermediate data. The set of input wrapper chains receives the test response data, and provides the test response data to be captured as output test data at the set of output channels to test the inter-partition circuit.

20 Claims, 5 Drawing Sheets

(56) References Cited

U.S. PATENT DOCUMENTS

| | | | | |
|---|---|---|---|---|
| 2008/0265906 A1* | 10/2008 | Waayers | .......... | G01R 31/31919 |
| | | | | 324/537 |
| 2008/0288842 A1* | 11/2008 | Waayers | ........ | G01R 31/318563 |
| | | | | 714/729 |
| 2008/0290878 A1* | 11/2008 | Waayers | ........ | G01R 31/318555 |
| | | | | 324/537 |
| 2011/0099442 A1* | 4/2011 | Hales | .............. | G01R 31/318533 |
| | | | | 714/729 |
| 2011/0221502 A1* | 9/2011 | Meijer | ........... | G01R 31/318508 |
| | | | | 327/333 |
| 2012/0124439 A1* | 5/2012 | Kim | ................. | G01R 31/31723 |
| | | | | 714/731 |

OTHER PUBLICATIONS

Goel et al., Testing of SoCs with Hierarchical Cores: Common Fallacies, Test Access Optimization, and Test Scheduling, Mar. 2009, IEEE, vol. 58, No. 3, pp. 409-423. (Year: 2009).*

Qi et al. Design for testability features of Godson-3 multicore microprocessor, Mar. 2011, Journal of Computer Science and Technology 26(2): 302-313 . (Year: 2011).*

Sehgal et al., IEEE P1500-Compliant Test Wrapper Design for Hierarchical Cores, 2004, IEEE, pp. 1203-1212. (Year: 2004).*

Sehgal et al., Test Cost Reduction for the AMDTM Athlon Processor using Test Partitioning, 2007, IEEE, pp. 1-10. (Year: 2007).*

DaSilva, et al. "Overview of the IEEE P1500 Standard", IEEE ITC International Test Conference, pp. 988-997, Paper 38.1, vol. 1, (2003).

* cited by examiner

SCAN WRAPPER ARCHITECTURE FOR SYSTEM-ON-CHIP

BACKGROUND

The present disclosure relates generally to system-on-chips (SoCs), and, more particularly, to a scan wrapper architecture for an SoC.

SoCs have made it possible to embed complex electronic designs on a single chip. An SoC may suffer from various manufacturing defects caused by, for example, contamination by dust particles during fabrication, overheating during fabrication, or the like. Such manufacturing defects may affect the operations of the SoC, and hence, testing the SoC for defects is essential.

Scan testing is a known approach for testing SoCs. Scan testing allows test data to be loaded into an SoC and tests to be executed from the loaded test data. Specific test data can be loaded into an SoC by designing into the SoC a special operational mode called a "scan mode" during which all state elements (e.g., flip-flops) of the SoC are serially chained to form scan chains that function as shift registers. During scan testing, shift and capture operations are performed, in which test patterns are shifted through the scan chains. A flat shift operation on a large SoC design is not feasible due to pin limitations and power considerations. Thus, today's SoCs are divided into multiple partitions (i.e., cores) that are tested independently. A partition typically includes multiple scan chains that form the core logic of the partition and wrapper chains at input and output boundaries to isolate the partition from the remaining design.

For detecting defects in the core logic of the partitions, the partitions are operated in an internal test (INTEST) mode, and for detecting defects in external logic between consecutive partitions, the partitions are operated in an external test (EXTEST) mode. During the EXTEST mode, the wrapper chains at the input boundary of a partition capture data from an inter-partition circuit coupled to the input boundary and the wrapper chains at an output boundary of the partition provide (or launch) data to an inter-partition circuit coupled to the output boundary. Further, existing test architectures use output pins to observe the data stored in the wrapper chains at the output boundary and input pins to control the data to be stored in the wrapper chains at the input boundary, during the EXTEST mode. Since the SoC has a limited number of input/output pins, only a limited number of partitions could be activated simultaneously in the EXTEST mode. As only a limited number of partitions could be activated simultaneously, a large number of test-combinations are required to achieve a desired testing coverage and test-pattern count, which in turn increases a test time of the SoC.

In light of the foregoing, there exists a need for a technical solution that solves the abovementioned problems, and ensures higher test coverage with lesser number of test-combinations.

SUMMARY

In one embodiment, a system-on-chip (SoC) is disclosed. The SoC includes a first set of input channels, a first partition, a first set of output channels, a second partition, and an inter-partition circuit. The first partition comprises a first set of output wrapper chains coupled to the first set of input channels and the second partition comprises a set of input wrapper chains coupled to the first set of output channels. The inter-partition circuit coupled between the first partition and the second partition. In an external test (EXTEST) mode of the SoC, the first set of input channels is configured to receive first input test data. The first set of output wrapper chains is configured to receive and store first intermediate data. The first intermediate data is generated based on the first input test data. The first intermediate data stored by the first set of output wrapper chains remains unobserved. The inter-partition circuit is configured to receive the first intermediate data from the first set of output wrapper chains and generate test response data based on the first intermediate data. The set of input wrapper chains is configured to receive the test response data, and provide first output test data to be captured at the first set of output channels to test the inter-partition circuit. The first output test data is generated based on the test response data.

In another embodiment, a method for testing a system-on-chip (SoC) is disclosed. The SoC includes first and second partitions coupled by way of an inter-partition circuit. The method includes operating the SoC in an external test (EXTEST) mode. Operating the SoC in the EXTEST mode includes receiving first input test data at a first set of input channels coupled to the first partition. The method further includes storing first intermediate data in a set of output wrapper chains of the first partition. The first intermediate data is generated based on the first input test data. The first intermediate data stored in the set of output wrapper chains of the first partition remains unobserved. The method includes providing the first intermediate data to the inter-partition circuit by the set of output wrapper chains. The method includes receiving test response data by a set of input wrapper chains of the second partition from the inter-partition circuit. The test response data is generated based on the first intermediate data. The method includes capturing first output test data at a first set of output channels coupled to the set of input wrapper chains. The first output test data is generated based on the test response data. The inter-partition circuit is tested based on a comparison of the captured first output test data with first predefined data.

In another embodiment, a system-on-chip (SoC) is disclosed. The SoC includes a first set of input channels, a first partition, a first set of output channels, a second partition, and an inter-partition circuit. The first partition includes a first set of output wrapper chains coupled to the first set of input channels and the second partition includes a first set of scan chains and a second set of output wrapper chains coupled to the first set of output channels. The inter-partition circuit is coupled between the first partition and the second partition. In an external test (EXTEST) mode of the SoC, the first set of input channels is configured to receive first input test data. The first set of output wrapper chains is configured to receive and store first intermediate data. The first intermediate data is generated based on the first input test data. The first intermediate data stored by the first set of output wrapper chains remains unobserved. The inter-partition circuit is configured to receive the first intermediate data from the first set of output wrapper chains and generate test response data based on the first intermediate data. The first set of scan chains and the second set of output wrapper chains are configured to receive the test response data, and provide first output test data to be captured at the first set of output channels to test the inter-partition circuit. The first output test data is generated based on the test response data.

In one embodiment, a first compressor circuit is coupled between the set of input wrapper chains and the first set of output channels. In the EXTEST mode, the first compressor circuit is configured to receive the test response data from the set of input wrapper chains, compress the received test response data to generate the first output test data, and provide the first output test data to be captured at the first set of output channels.

In one embodiment, each of the first set of output wrapper chains include a first plurality of wrapper cells coupled in a series arrangement such that the first intermediate data is serially shifted into the first plurality of wrapper cells. Each of the set of input wrapper chains include a second plurality of wrapper cells coupled in a series arrangement. The test response data is serially shifted out of the second plurality of wrapper cells to provide to the first compressor circuit.

In one embodiment, the second partition further comprises a first set of selection circuits that is coupled to the set of input wrapper chains and the first compressor circuit. The first set of selection circuits is configured to receive an extest mode enable signal. In the EXTEST mode, the extest mode enable signal is active, and the first set of selection circuits is configured to receive the test response data from the set of input wrapper chains and provide the test response data to the first compressor circuit.

In one embodiment, the SoC further comprises a first decompressor circuit coupled between the first set of output wrapper chains and the first set of input channels. During the EXTEST mode, the first decompressor circuit is configured to receive the first input test data from the first set of input channels, decompress the first input test data to generate the first intermediate data, and provide the first intermediate data to the first set of output wrapper chains.

In one embodiment, the SoC further comprises a second set of input channels and a second set of output channels such that the first partition is coupled between the second set of input channels and the second set of output channels.

In one embodiment, the first partition further comprises a second decompressor circuit coupled to the second set of input channels, a second compressor circuit coupled to the second set of output channels, and a set of scan chains. The set of scan chains and the first set of output wrapper chains are coupled in a parallel arrangement between the second decompressor circuit and the second compressor circuit. During an internal test (INTEST) mode of the SoC, the second set of input channels is configured to receive second input test data. The second decompressor circuit is configured to decompress the second input test data to generate second intermediate data. The set of scan chains and the first set of output wrapper chains are configured to receive and store the second intermediate data. The second compressor circuit is configured to receive the second intermediate data from the set of scan chains and the first set of output wrapper chains, compress the second intermediate data to generate second output test data, and provide the second output test data to be captured at the second set of output channels to test the set of scan chains.

In one embodiment, the first partition further comprises a second set of selection circuits coupled to the first set of output wrapper chains, the first and second decompressor circuits, and configured to receive an extest mode enable signal. In the EXTEST mode, the extest mode enable signal is active, and the second set of selection circuits is configured to receive the first intermediate data from the first decompressor circuit and provide the first intermediate data to the first set of output wrapper chains based on the extest mode enable signal. In the INTEST mode, the extest mode enable signal is inactive, and the second set of selection circuits is configured to receive the second intermediate data from the second decompressor circuit and provide the second intermediate data to the first set of output wrapper chains based on the extest mode enable signal.

In one embodiment, the SoC further comprises a third decompressor circuit that shares the first set of input channels with the first decompressor circuit. The third decompressor circuit is configured to receive the first input test data and decompress the first input test data to generate third intermediate data. The second partition further includes a second set of output wrapper chains that is coupled to the third decompressor circuit and configured to receive the third intermediate data. The second set of output wrapper chains is separated from the set of input wrapper chains.

In another embodiment, the second partition further comprises an x-bounding logic circuit that is coupled to the inter-partition circuit and the first set of scan chains. During the EXTEST mode, the x-bounding logic circuit is configured to receive the test response data from the inter-partition circuit and provide the received test response data to the first set of scan chains and the second set of output wrapper chains.

In another embodiment, the SoC further includes a second set of input channels and a second set of output channels such that the first partition is coupled between the second set of input channels and the second set of output channels. The first partition further includes a decompressor circuit coupled to the second set of input channels, a compressor circuit coupled to the second set of output channels, and a second set of scan chains. The second set of scan chains and the first set of output wrapper chains are coupled in a parallel arrangement between the decompressor circuit and the compressor circuit. In an internal test (INTEST) mode of the SoC, the second set of input channels is configured to receive second input test data. The decompressor circuit is configured to decompress the second input test data to generate second intermediate data. The second set of scan chains and the first set of output wrapper chains are configured to receive and store the second intermediate data. The compressor circuit is configured to receive the second intermediate data from the second set of scan chains and the first set of output wrapper chains, compress the second intermediate data to generate second output test data, and provide the second output test data to be captured at the second set of output channels to test the second set of scan chains.

Thus, the SoC of present disclosure provides an optimal means to reduce input/output pin requirement during testing in EXTEST mode. The reduction in the pin requirement during the EXTEST mode allows for optimal assignment of input/output pins for testing additional partitions in the EXTEST or INTEST mode, thereby achieving higher test bandwidth. Since additional number of partitions could be tested in each test run, a desired test coverage and test pattern count could be achieved for the SoC of the present disclosure in significantly lesser test-combinations, time, and cost as compared to the conventional scan architectures.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
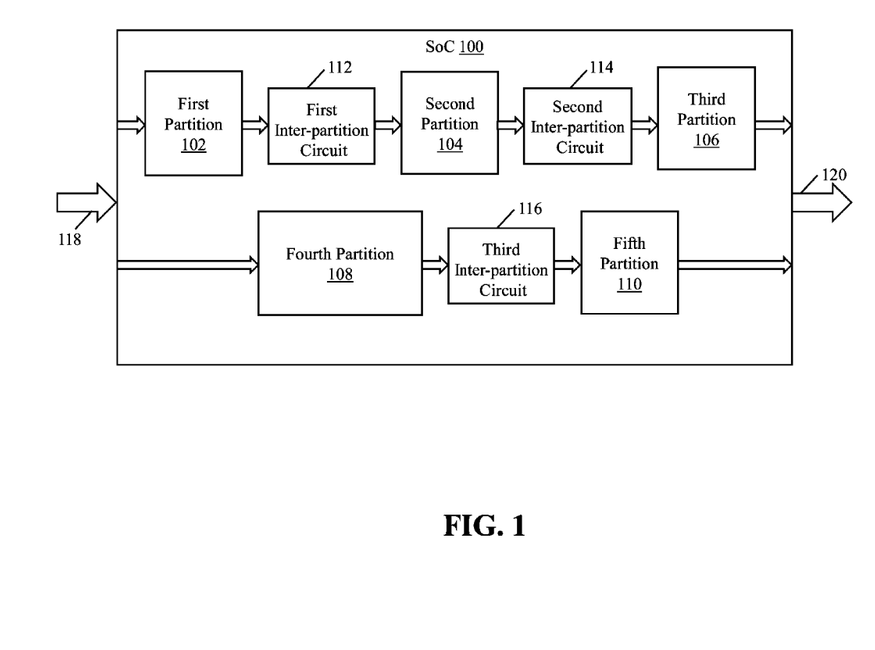
FIG. 1 illustrates a block diagram of a system-on-chip (SoC), in accordance with an exemplary embodiment of the disclosure.

FIG. 1 illustrates a block diagram of a system-on-chip (SoC) 100, in accordance with an exemplary embodiment of the disclosure. The SoC 100 refers to an integrated circuit (IC) embedded on a single printed circuit board (PCB). The SoC 100 may be embedded within an electronic system (not shown) such as an automotive system, an aircraft guidance system, a home security system, an industrial robotic system, or the like. The SoC 100 may be prone to manufacturing and operational defects, and hence requires to be tested in order to detect such defects. For ease of testing, the SoC 100 is divided into multiple cores or partitions (for example, first through fifth partitions 102-110) that are tested in various configurations and test runs to achieve a desired test coverage and test-pattern count for the SoC 100. The first through fifth partitions 102-110 may have identical or varying sizes without deviating from the scope of the disclosure.

The first through fifth partitions 102-110 are coupled by corresponding first through third inter-partition circuits 112-116. For example, the first and second partitions 102 and 104 are coupled with each other by way the first inter-partition circuit 112. The second and third partitions 104 and 106 are coupled with each other by way the second inter-partition circuit 114. The fourth and fifth partitions 108 and 110 are coupled with each other by way the third inter-partition circuit 116. The first through third inter-partition circuits 112-116 refer to nodes, electrical traces, and/or logic circuits that couple two consecutive partitions of the SoC 100. The SoC 100 further includes a plurality of input pins 118 and a plurality of output pins 120 for external coupling.

The SoC 100 is tested to detect defects in core logic of each of the first through fifth partitions 102-110 and interconnections (i.e., the first through third inter-partition circuits 112-116) between the first through fifth partitions 102-110. The SoC 100 is tested in internal test (INTEST) mode and an external test (EXTEST) mode. In the INTEST mode, the core logic of the first through fifth partitions 102-110 is tested, and in the EXTEST mode, the interconnections (i.e., the first through third inter-partition circuits 112-116) between the first through fifth partitions 102-110 are tested.

For the sake of brevity, the SoC 100 is shown to include five partitions (i.e., the first through fifth partitions 102-110) and three inter-partition circuits (i.e., the first through third inter-partition circuits 112-116). In other embodiments, the SoC 100 may include a different count of partitions, inter-partition circuits, and input/output pins and may have a different organization thereof.

Figure 2:
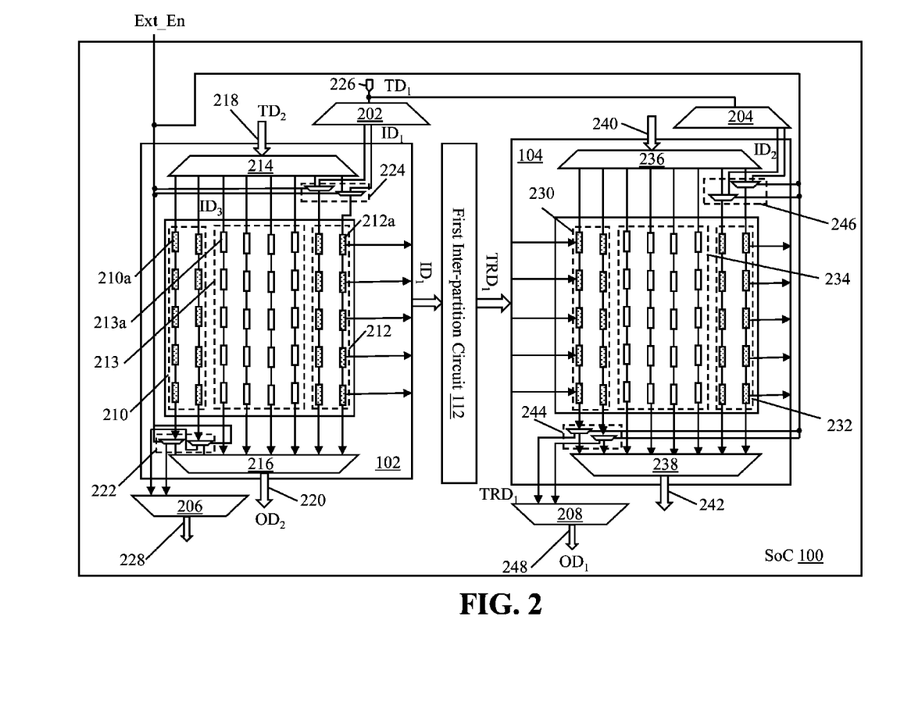
FIG. 2 illustrates a schematic diagram that illustrates at least a portion of the SoC having a scan wrapper architecture, in accordance with an exemplary embodiment of the disclosure.

FIG. 2 illustrates a schematic diagram that illustrates at least a portion of the SoC 100 having a scan wrapper architecture, in accordance with an exemplary embodiment of the disclosure. For the sake of brevity, FIG. 2 has been described with respect to the first partition 102, the second partition 104, and the first inter-partition circuit 112. It will be apparent to a person of ordinary skill in the art that the other partitions 106-110 and the other inter-partition circuits 114 and 116 of the SoC 100 are also designed and tested in accordance with the scan wrapper architecture of FIG. 2. In accordance with the scan wrapper architecture of FIG. 2, the SoC 100 further includes first and second decompressor circuits 202 and 204 and first and second compressor circuits 206 and 208.

The first partition 102 includes a first set of input wrapper chains 210 at an input boundary of the first partition 102, a first set of output wrapper chains 212 at an output boundary of the first partition 102, and a first set of scan chains 213 arranged between the first set of input wrapper chains 210 and the first set of output wrapper chains 212. The first set of input wrapper chains 210 is separated from the first set of output wrapper chains 212. Each input wrapper chain 210 includes a first plurality of wrapper cells and each output wrapper chain 212 includes a second plurality of wrapper cells. The first plurality of wrapper cells in each input wrapper chain 210 and the second plurality of wrapper cells in each output wrapper chain 212 are coupled in a series arrangement as shown in FIG. 2. For the sake of brevity, only one wrapper cell (wrapper cells 210a and 212a) in each of the first set of input wrapper chains 210 and the first set of output wrapper chains 212 is labeled in FIG. 2. The first plurality of wrapper cells in each input wrapper chain 210 and the second plurality of wrapper cells in each output wrapper chain 212 may be implemented using various wrapper architectures known in the art. For example, the first and second pluralities of wrapper cells (e.g., the wrapper cells 210a and 212a) may be implemented based on IEEE 1500 standard, IEEE 1149. 1 standard, or the like. Each scan chain 213 includes a first plurality of scan cells coupled in a series arrangement as shown in FIG. 2. For the sake of brevity, only one scan cell 213a in the first set of scan chains 213 is labelled in FIG. 2. The first plurality of scan cells in each scan chain 213 may be implemented using flip-flops.

The first partition 102 further includes a third decompressor circuit 214 and a third compressor circuit 216. The first set of input wrapper chains 210, the first set of output wrapper chains 212, and the first set of scan chains 213 are coupled in a parallel arrangement between the third decompressor circuit 214 and the third compressor circuit 216. The third decompressor circuit 214 is coupled to a first set of input channels 218 at corresponding input and to the first set of input wrapper chains 210, the first set of output wrapper chains 212, and the first set of scan chains 213 at corresponding output. The third decompressor circuit 214 is configured to implement a decompression logic to decompress data that is received at an input of the third decompressor circuit 214. The third compressor circuit 216 is coupled to the first set of input wrapper chains 210, the first set of output wrapper chains 212, and the first set of scan chains 213 at corresponding input and a first set of output channels 220 at corresponding output. The third compressor circuit 216 is configured to implement a compression logic to compress data that is received at an input of the third compressor circuit 216.

The first partition 102 further includes first and second sets of selection circuits 222 and 224. The first set of selection circuits 222 is coupled to the first set of input wrapper chains 210 at corresponding input, and the first and third compressor circuits 206 and 216 at corresponding output. Examples of the first set of selection circuits 222 may include demultiplexers (DEMUX). The second set of selection circuits 224 is coupled to the first and third decompressor circuits 202 and 214 at corresponding input, and the first set of output wrapper chains 212 at corresponding output. Examples of the second set of selection circuits 224 may include multiplexers (MUX). Each of the first and second sets of selection circuits 222 and 224 is configured to receive an extest mode enable signal Ext_En. The extest mode enable signal Ext_En is active during the EXTEST mode and inactive during INTEST mode. In one embodiment, the extest mode enable signal Ext_En is active when at logic low state and inactive when at logic high state. In another embodiment, the extest mode enable signal Ext_En is active when at logic high state and inactive when at logic low state.

The first decompressor circuit 202 is coupled to a second set of input channels 226 at corresponding input and the second set of selection circuits 224 at corresponding output. Thus, the first set of output wrapper chains 212 is coupled to the second set of input channels 226 by way of the first decompressor circuit 202 and the second set of selection circuits 224. The first decompressor circuit 202 is configured to implement a decompression logic to decompress data that is received at an input of the first decompressor circuit 202. The first compressor circuit 206 is coupled to the first set of selection circuits 222 at corresponding input and a second set of output channels 228 at corresponding output. The first compressor circuit 206 is configured to implement a compression logic to compress data that is received at an input of the first compressor circuit 206.

The second partition 104 includes a second set of input wrapper chains 230 at an input boundary of the second partition 104, a second set of output wrapper chains 232 at an output boundary of the second partition 104, and a second set of scan chains 234 arranged between the second set of input wrapper chains 230 and the second set of output wrapper chains 232. The second set of input wrapper chains 230 is separated from the second set of output wrapper chains 232. Each input wrapper chain 230 includes a third plurality of wrapper cells and each output wrapper chain 232 includes a fourth plurality of wrapper cells. The third plurality of wrapper cells in each input wrapper chain 230 and the fourth plurality of wrapper cells in each output wrapper chain 232 are coupled in a series arrangement as shown in FIG. 2. The third plurality of wrapper cells in each input wrapper chain 230 and the fourth plurality of wrapper cells in each output wrapper chain 232 may be implemented using various wrapper architectures known in the art. For example, the third and fourth pluralities of wrapper cells may be implemented based on IEEE 1500 standard, IEEE 1149. 1 standard, or the like. Each scan chain 234 includes a second plurality of scan cells coupled in a series arrangement as shown in FIG. 2. The second plurality of scan cells in each scan chain 234 may be implemented using flip-flops.

The second partition 104 further includes a fourth decompressor circuit 236 and a fourth compressor circuit 238. The second set of input wrapper chains 230, the second set of output wrapper chains 232, and the second set of scan chains 234 are coupled in a parallel arrangement between the fourth decompressor circuit 236 and the fourth compressor circuit 238. The fourth decompressor circuit 236 is coupled to a third set of input channels 240 at corresponding input and to the second set of input wrapper chains 230, the second set of output wrapper chains 232, and the second set of scan chains 234 at corresponding output. The fourth decompressor circuit 236 is configured to implement a decompression logic to decompress data that is received at an input of the fourth decompressor circuit 236. The fourth compressor circuit 238 is coupled to the second set of input wrapper chains 230, the second set of output wrapper chains 232, and the second set of scan chains 234 at corresponding input and to a third set of output channels 242 at corresponding output. The fourth compressor circuit 238 is configured to implement a compression logic to compress data that is received at an input of the fourth compressor circuit 238.

The second partition 104 further includes third and fourth sets of selection circuits 244 and 246. The third set of selection circuits 244 is coupled to the second set of input wrapper chains 230 at corresponding input and the second and fourth compressor circuits 208 and 238 at corresponding output. Examples of the third set of selection circuits 244 may include demultiplexers (DEMUX). The fourth set of selection circuits 246 is coupled to the second and fourth decompressor circuits 204 and 236 at corresponding input and the second set of output wrapper chains 232 at corresponding output. Examples of the fourth set of selection circuits 246 may include multiplexers (MUX). Each of the third and fourth sets of selection circuits 244 and 246 is configured to receive the extest mode enable signal Ext_En.

The second decompressor circuit 204 is coupled to the second set of input channels 226 at corresponding input and the fourth set of selection circuits 246 at corresponding output. In other words, the second decompressor circuit 204 shares the second set of input channels 226 with the first decompressor circuit 202. The sharing of the second set of input channels 226 between the first and second decompressor circuits 202 and 204 frees up additional input/output pins for other testing purposes. The second decompressor circuit 204 is configured to implement a decompression logic to decompress data that is received at an input of the second decompressor circuit 204. The second compressor circuit 208 is coupled to the third set of selection circuits 244 at corresponding input and a fourth set of output channels 248 at corresponding output. Thus, the second set of input wrapper chains 230 is coupled to the fourth set of output channels 248 by way of the second compressor circuit 208 and the third set of selection circuits 244. The second compressor circuit 208 is configured to implement a compression logic to compress data that is received at an input of the second compressor circuit 208.

The first and second partitions 102 and 104 may be operated in the INTEST mode and the EXTEST mode for scan testing based on the active or inactive state of the extest mode enable signal Ext_En. Test pattern, for testing the core logic of the first and second partitions 102 and 104 and the interconnections between the first and second partitions 102 and 104, is generated by an automatic test pattern generator (not shown) coupled to the SoC 100.

During the EXTEST mode, the second set of input channels 226, the first decompressor circuit 202, the second set of selection circuits 224, and the first set of output wrapper chains 212 remain active. The first inter-partition circuit 112 is also active. Further, the second set of input wrapper chains 230, the third set of selection circuits 244, the second compressor circuit 208, and the fourth set of output channels 248 are active. The first set of input channels 218, the third decompressor circuit 214, the first set of scan chains 213, the third compressor circuit 216, and the first set of output channels 220 remain inactive. Further, the third set of input channels 240, the fourth decompressor circuit 236, the second set of scan chains 234, the fourth compressor circuit 238, and the third set of output channels 242 also remain inactive.

The automatic test pattern generator coupled to the SoC 100 is configured to generate first input test data $TD_1$ (i.e., a first test pattern) and provide the first input test data $TD_1$ to the second set of input channels 226. In an embodiment, the first input test data $TD_1$ corresponds to compressed test stimuli retrieved by the automatic test pattern generator from corresponding memory. The second set of input channels 226 is configured to provide the received first input test data $TD_1$ at an input of the first decompressor circuit 202. The first decompressor circuit 202 is configured to receive the first input test data $TD_1$ and implement the decompression logic. Based on the decompression logic, the first decompressor circuit 202 is configured to decompress the first input test data $TD_1$ to generate first intermediate data $ID_1$. The first decompressor circuit 202 is further configured to provide the generated first intermediate data $ID_1$ to an input of the second set of selection circuits 224.

In the EXTEST mode, the second set of selection circuits 224 is configured to receive the extest mode enable signal Ext_En in the active state. Based on the active state of the extest mode enable signal Ext_En, the second set of selection circuits 224 is further configured to provide the first intermediate data $ID_1$ to the first set of output wrapper chains 212. The first set of output wrapper chains 212 is configured to receive and store the first intermediate data $ID_1$. For storing the first intermediate data $ID_1$ in the first set of output wrapper chains 212, the first intermediate data $ID_1$ is serially shifted into the second plurality of wrapper cells of the first set of output wrapper chains 212. In other words, leading wrapper cells of the first set of output wrapper chains 212 receive the first intermediate data $ID_1$ from the second set of selection circuits 224 which is serially shifted until the first intermediate data $ID_1$ is received by trailing wrapper cells of the first set of output wrapper chains 212. The first intermediate data $ID_1$ is considered to be stored in the first set of output wrapper chains 212, when the trailing wrapper cells of the first set of output wrapper chains 212 receive the first intermediate data $ID_1$. The first intermediate data $ID_1$ stored by the first set of output wrapper chains 212 remains unobserved. In other words, no output channels or pins are dedicated for observing or capturing the first intermediate data $ID_1$ stored in the first set of output wrapper chains 212 during the EXTEST mode in the scan wrapper architecture of FIG. 2.

The first inter-partition circuit 112 that is coupled to the output boundary of the first partition 102 is configured to receive the first intermediate data $ID_1$ from the first set of output wrapper chains 212. The first inter-partition circuit 112 is configured to generate first test response data $TRD_1$ based on the first intermediate data $ID_1$. In an example, the first inter-partition circuit 112 may implement an interconnection logic to manipulate the first intermediate data $ID_1$ to generate the first test response data $TRD_1$. In another example, the first inter-partition circuit 112 may correspond to electrical trace between the first and second partitions 102 and 104. In such an embodiment, the first test response data $TRD_1$ generated by the first inter-partition circuit 112 is same as the first intermediate data $ID_1$. The first inter-partition circuit 112 is further configured to provide the first test response data $TRD_1$ as an input to the second set of input wrapper chains 230.

The second set of input wrapper chains 230 is configured to store the first test response data $TRD_1$. In other words, the third plurality of wrapper cells of the second set of input wrapper chains 230 are configured to receive and store the first test response data $TRD_1$ therein. The second set of input wrapper chains 230 remains uncontrolled. In other words, no input channels or pins are dedicated in the scan wrapper architecture of FIG. 2 for controlling data to be stored in the second set of input wrapper chains 230 during the EXTEST mode.

The first test response data $TRD_1$ is then serially shifted out of the third plurality of wrapper cells of the second set of input wrapper chains 230 for providing to the third set of selection circuits 244. The third set of selection circuits 244 is configured to receive the extest mode enable signal Ext_En in the active state and the serially shifted first test response data $TRD_1$. Based on the active state of the extest mode enable signal Ext_En, the third set of selection circuits 244 is configured to provide the serially shifted first test response data $TRD_1$ to the second compressor circuit 208.

The second compressor circuit 208 is configured to receive the serially shifted first test response data $TRD_1$ from the third set of selection circuits 244 and implement the compression logic. Based on the compression logic, the second compressor circuit 208 is configured to compress the received first test response data $TRD_1$ to generate first output test data $OD_1$. In other words, the first output test data $OD_1$ is generated based on the first test response data $TRD_1$. The second compressor circuit 208 is further configured to provide the generated first output test data $OD_1$ to be captured at the fourth set of output channels 248 for testing the logic of the first inter-partition circuit 112.

The first output test data $OD_1$ may be captured by the automatic test pattern generator, which compares the captured first output test data $OD_1$ with first predefined data (i.e., an expected output of the first inter-partition circuit 112). The first predefined data may be stored in the memory of the automatic test pattern generator. A match of the first output test data $OD_1$ with the first predefined data indicates that the interconnection between the first and second partitions 102 and 104 (i.e., the first inter-partition circuit 112) is free of any defect. However, a mismatch between the first output test data $OD_1$ and the first predefined data indicates that the interconnection between the first and second partitions 102 and 104 (i.e., the first inter-partition circuit 112) has one or more defects affecting the operations of the first inter-partition circuit 112.

In an embodiment, the first set of input wrapper chains 210, the first set of selection circuits 222, the first compressor circuit 206, and the second set of output channels 228 may also remain active if any inter-partition circuit at the input boundary of the first partition 102 is to be tested in the EXTEST mode.

In an embodiment, the second decompressor circuit 204, the fourth set of selection circuits 246, and the second set of output wrapper chains 232 may also remain active to test the second inter-partition circuit 114 at the output boundary of the second partition 104 in the EXTEST mode. In such a scenario, the second decompressor circuit 204 is configured to receive the first input test data $TD_1$ and decompress the first input test data $TD_1$ to generate second intermediate data $ID_2$. The second set of output wrapper chains 232 is configured to receive the second intermediate data $ID_2$ from the second decompressor circuit 204.

It will be apparent to a person of ordinary skill in the art that multiple partitions in the SoC 100 may operate in the EXTEST mode simultaneously depending upon the availability of the input pins 118 and the output pins 120. Further, while a first set of partitions (e.g., the first through third partitions 102-106) in the SoC 100 operate in the EXTEST mode, a second set partitions (e.g., the fourth and fifth partitions 108 and 110) in the SoC 100 may operate in the INTEST mode depending upon the availability of the input pins 118 and the output pins 120.

For the sake of brevity, the INTEST mode is described with regards to the testing of the core logic of the first partition 102. It will be apparent to a person of ordinary skill in the art that the core logic of the second partition 104 is also tested in a similar manner as described for the first partition 102.

During the INTEST mode, the first set of input channels 218, the third decompressor circuit 214, the first and second sets of selection circuits 222 and 224, the third compressor circuit 216, the first set of input wrapper chains 210, the first set of scan chains 213, the first set of output wrapper chains 212, and the first set of output channels 220 are active. The second set of input channels 226, the first decompressor circuit 202, the first compressor circuit 206, and the second set of output channels 228 are inactive.

The automatic test pattern generator is further configured to generate second input test data $TD_2$ (i.e., a second test pattern) and provide the second input test data $TD_2$ to the first set of input channels 218. In an embodiment, the second input test data $TD_2$ corresponds to compressed test stimuli retrieved by the automatic test pattern generator from the corresponding memory. The first set of input channels 218 is configured to provide the received second input test data $TD_2$ at an input of the third decompressor circuit 214. The third decompressor circuit 214 is configured to receive the second input test data $TD_2$ and implement the decompression logic. Based on the decompression logic, the third decompressor circuit 214 is configured to decompress the second input test data $TD_2$ to generate third intermediate data $ID_3$. The third decompressor circuit 214 is further configured to provide the generated third intermediate data $ID_3$ to the first set of input wrapper chains 210 and the first set of scan chains 213. The third decompressor circuit 214 is further configured to provide the generated third intermediate data $ID_3$ to the first set of output wrapper chains 212 via the second set of selection circuits 224. During the INTEST mode, the second set of selection circuits 224 receive the extest mode enable signal Ext_En the inactive state. Based on the inactive state of the extest mode enable signal Ext_En, the second set of selection circuits 224 is configured to provide the third intermediate data $ID_3$ received from the third decompressor circuit 214 to the first set of output wrapper chains 212.

In other words, based on the active or inactive state of the extest mode enable signal Ext_En, the second set of selection circuits 224 selects one of an output of the first decompressor circuit 202 and the third decompressor circuit 214 to be provided as input to the first set of output wrapper chains 212.

During the INTEST mode, the first set of input wrapper chains 210 isolates the first set of scan chains 213 from any functional or unknown input received at the input boundary of the first partition 102 and the first set of output wrapper chains 212 masks any functional output of the first set of scan chains 213. The first set of input wrapper chains 210, the first set of output wrapper chains 212, and the first set of scan chains 213 are configured to receive and store the third intermediate data $ID_3$. For storing the third intermediate data $ID_3$ in the first set of input wrapper chains 210, the third intermediate data $ID_3$ is serially shifted into the first plurality of wrapper cells of the first set of input wrapper chains 210. In other words, leading wrapper cells of the first set of input wrapper chains 210 receive the third intermediate data $ID_3$ which is serially shifted until the third intermediate data $ID_3$ is received by trailing wrapper cells of the first set of input wrapper chains 210. The third intermediate data $ID_3$ is considered to be stored in the first set of input wrapper chains 210, when the trailing wrapper cells of the first set of input wrapper chains 210 receive the third intermediate data $ID_3$. For storing the third intermediate data $ID_3$ in the first set of scan chains 213, the third intermediate data $ID_3$ is serially shifted into the plurality of scan cells of the first set of scan chains 213. In other words, leading scan cells of the first set of scan chains 213 receive the third intermediate data $ID_3$ which is serially shifted until the third intermediate data $ID_3$ is received by trailing scan cells of the first set of scan chains 213. The third intermediate data $ID_3$ is considered to be stored in the first set of scan chains 213, when the trailing scan cells of the first set of scan chains 213 receive the third intermediate data $ID_3$. For storing the third intermediate data $ID_3$ in the first set of output wrapper chains 212, the third intermediate data $ID_3$ is serially shifted into the second plurality of wrapper cells of the first set of output wrapper chains 212. In other words, leading wrapper cells of the first set of output wrapper chains 212 receive the third intermediate data $ID_3$ which is serially shifted until the third intermediate data $ID_3$ is received by trailing wrapper cells of the first set of output wrapper chains 212. The third intermediate data $ID_3$ is considered to be stored in the first set of output wrapper chains 212, when the trailing wrapper cells of the first set of output wrapper chains 212 receive the third intermediate data $ID_3$.

The stored third intermediate data $ID_3$ is then shifted out of the first set of scan chains 213 and the first set of output wrapper chains 212 for providing to the third compressor circuit 216. The stored third intermediate data $ID_3$ is further shifted out of the first set of input wrapper chains 210 and provided to the third compressor circuit 216 by way of the first set of selection circuits 222. During the INTEST mode, the first set of selection circuits 222 receive the extest mode enable signal Ext_En the inactive state. Based on the inactive state of the extest mode enable signal Ext_En, the first set of selection circuits 222 is configured to provide the serially shifted third intermediate data $ID_3$ from the first set of input wrapper chains 210 to the third compressor circuit 216.

In other words, based on the active or inactive state of the extest mode enable signal Ext_En, the first set of selection circuits 222 selects one of the first compressor circuit 206 and the third compressor circuit 216 for providing data serially shifted out of the first set of input wrapper chains 210.

The third compressor circuit 216 is configured to implement the compression logic on the third intermediate data $ID_3$. By implementing the compression logic, the third compressor circuit 216 is configured to compress the third intermediate data $ID_3$ to generate second output test data $OD_2$. The third compressor circuit 216 is further configured to provide the second output test data OD₂ to be captured at the first set of output channels 220 for testing the core logic implemented by the first set of scan chains 213.

The second output test data OD₂ may be captured by the automatic test pattern generator, which compares the captured second output test data OD₂ with second predefined data (i.e., an expected output of the first partition 102). The second predefined data may be stored in the memory of the automatic test pattern generator. A match of the second output test data OD₂ with the second predefined data indicates that the core logic of the first partition 102 is free of any defect. However, a mismatch between the second output test data OD₂ and the second predefined data indicates that the core logic of the first partition 102 has one or more defects affecting the operations of the first partition 102.

Although the first and second decompressor circuits 202 and 204 are shown to be included in the SoC 100, the scope of the disclosure is not limited to it. In another embodiment, second and fourth selection circuits 224 and 246 may be directly coupled to the second set of input channels 226 without deviating from the scope of the disclosure. In such an embodiment, input test data provided by the automatic test pattern generator is regular test stimuli instead of compressed test stimuli.

Figure 3:
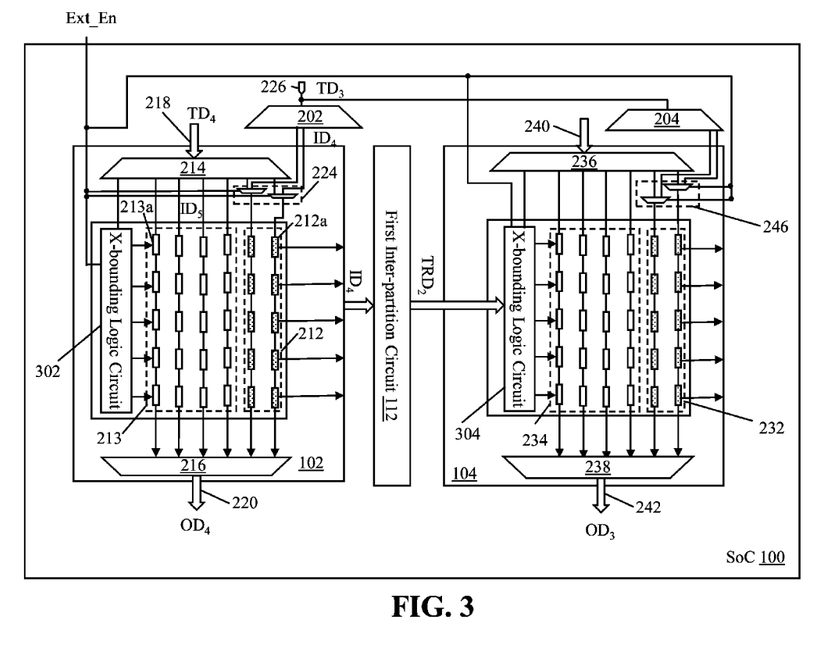
FIG. 3 illustrates a schematic diagram that illustrates at least a portion of the SoC having a scan wrapper architecture, in accordance with another exemplary embodiment of the disclosure.

FIG. 3 illustrates a schematic diagram that illustrates a scan wrapper architecture for testing at least a portion of the SoC 100, in accordance with another exemplary embodiment of the disclosure. For the sake of brevity, FIG. 3 has been described with respect to the first partition 102, the second partition 104, and the first inter-partition circuit 112. It will be apparent to a person of ordinary skill in the art that the other partitions 106-110 and the other inter-partition circuits 114 and 116 of the SoC 100 are also designed and tested in accordance with the scan wrapper architecture of FIG. 3. In accordance with the scan wrapper architecture of FIG. 3, the SoC 100 further includes the first and second decompressor circuits 202 and 204 and does not include the first and second compressor circuits 206 and 208.

The first partition 102 includes a first X-bounding logic circuit 302 at the input boundary instead of the first set of input wrapper chains 210. The first partition 102 further includes the first set of output wrapper chains 212 at the output boundary of the first partition 102 and the first set of scan chains 213 arranged between the first X-bounding logic circuit 302 and the first set of output wrapper chains 212. The first X-bounding logic circuit 302 isolates the first set of scan chains 213 from any functional or unknown input received at the input boundary of the first partition 102 during the INTEST mode. The first X-bounding logic circuit 302 may be implemented using one or more combinational logic circuits that are configured to implement a controlled propagation of data within a circuit. The first X-bounding logic circuit 302 is implemented by way of one or more dedicated logic gates, registers, multiplexers, and/or other suitable circuit elements. For sake of brevity in the ongoing description, the first X-bounding logic circuit 302 is assumed to be implemented by using one or more multiplexers.

The first partition 102 further includes the third decompressor circuit 214 and the third compressor circuit 216. The first set of output wrapper chains 212 and the first set of scan chains 213 are coupled in a parallel arrangement between the third decompressor circuit 214 and the third compressor circuit 216. The third decompressor circuit 214 is coupled to the first set of input channels 218 at corresponding input and to the first X-bounding logic circuit 302, the first set of output wrapper chains 212, and the first set of scan chains 213 at corresponding output. The third compressor circuit 216 is coupled to the first set of output wrapper chains 212 and the first set of scan chains 213 at corresponding input and the first set of output channels 220 at corresponding output.

The first partition 102 further includes the second set of selection circuits 224. The second set of selection circuits 224 is coupled to the first and third decompressor circuits 202 and 214 at corresponding input and the first set of output wrapper chains 212 at corresponding output. The first decompressor circuit 202 is coupled to the second set of input channels 226 at corresponding input and the second set of selection circuits 224 at corresponding output.

The second partition 104 includes a second X-bounding logic circuit 304 at the input boundary instead of the second set of input wrapper chains 230. The second partition 104 further includes the second set of output wrapper chains 232 at the output boundary of the second partition 104 and the second set of scan chains 234 arranged between the second X-bounding logic circuit 304 and the second set of output wrapper chains 232. The second X-bounding logic circuit 304 isolates the second set of scan chains 234 from any functional or unknown input received at the input boundary of the second partition 104 during the INTEST mode. The second X-bounding logic circuit 304 may be implemented using one or more combinational logic circuits that are configured to implement a controlled propagation of data within a circuit. The second second X-bounding logic circuit 304 is implemented by way of one or more dedicated logic gates, registers, multiplexers, and/or other suitable circuit elements. For sake of brevity in the ongoing description, the second X-bounding logic circuit 304 is assumed to be implemented by using one or more multiplexers.

The second partition 104 further includes the fourth decompressor circuit 236 and the fourth compressor circuit 238. The second set of output wrapper chains 232 and the second set of scan chains 234 are coupled in a parallel arrangement between the fourth decompressor circuit 236 and the fourth compressor circuit 238. The fourth decompressor circuit 236 is coupled to the third set of input channels 240 at corresponding input and to the second X-bounding logic circuit 304, the second set of output wrapper chains 232, and the second set of scan chains 234 at corresponding output. The fourth compressor circuit 238 is coupled to the second set of output wrapper chains 232 and the second set of scan chains 234 at corresponding input and to the third set of output channels 242 at corresponding output.

The second partition 104 further includes the fourth set of selection circuits 246. The fourth set of selection circuits 246 is coupled to the second and fourth decompressor circuits 204 and 236 at corresponding input and the second set of output wrapper chains 232 at corresponding output.

During the EXTEST mode, the first decompressor circuit 202, the second set of selection circuits 224, and the first set of output wrapper chains 212 remain active. The first inter-partition circuit 112 is also active. Further, the second X-bounding logic circuit 304, the second set of scan chains 234, the second set of output wrapper chains 232, the fourth compressor circuit 238, and the third set of output channels 242 are active. The first set of input channels 218, the third decompressor circuit 214, the first set of scan chains 213, the third compressor circuit 216, and the first set of output channels 220 remain inactive. Further, the third set of input channels 240, and the fourth decompressor circuit 236 also remain inactive.

The automatic test pattern generator is configured to generate third input test data $TD_3$ (i.e., a third test pattern) and provide the third input test data $TD_3$ to the second set of input channels 226. In an embodiment, the third input test data $TD_3$ corresponds to compressed test stimuli retrieved by the automatic test pattern generator from the corresponding memory. The second set of input channels 226 is configured to provide the received third input test data $TD_3$ at the input of the first decompressor circuit 202. The first decompressor circuit 202 is configured to decompress the third input test data $TD_3$ to generate fourth intermediate data ID4. The first decompressor circuit 202 is further configured to provide the generated fourth intermediate data $ID_4$ to the input of the second set of selection circuits 224.

In the EXTEST mode, the second set of selection circuits 224 is configured to receive the extest mode enable signal Ext_En in the active state. Based on the active state of the extest mode enable signal Ext_En, the second set of selection circuits 224 is further configured to provide the fourth intermediate data $ID_4$ to the first set of output wrapper chains 212. The first set of output wrapper chains 212 is configured to receive and store the fourth intermediate data $ID_4$. For storing the fourth intermediate data $ID_4$, the fourth intermediate data $ID_4$ is serially shifted into the second plurality of wrapper cells of the first set of output wrapper chains 212. The fourth intermediate data $ID_4$ stored by the first set of output wrapper chains 212 remains unobserved. In other words, no output channels or pins are dedicated for observing or capturing the fourth intermediate data $ID_4$ stored in the first set of output wrapper chains 212 during the EXTEST mode in the scan wrapper architecture of FIG. 3.

The first inter-partition circuit 112 that is coupled to the output boundary of the first partition 102 is configured to receive the fourth intermediate data $ID_4$ from the first set of output wrapper chains 212. The first inter-partition circuit 112 is configured to generate second test response data $TRD_2$ based on the fourth intermediate data $ID_4$. The first inter-partition circuit 112 is further configured to provide the second test response data $TRD_2$ as an input to the second X-bounding logic circuit 304.

In the EXTEST mode, the second X-bounding logic circuit 304 is configured to receive the extest mode enable signal Ext_En in the active state. Based on the active state of the extest mode enable signal Ext_En, the second X-bounding logic circuit 304 is configured to provide the second test response data $TRD_2$ to the second set of scan chains 234 and the second set of output wrapper chains 232. The second set of scan chains 234 and the second set of output wrapper chains 232 are configured to store the second test response data $TRD_2$. In other words, the second plurality of scan cells of the second set of scan chains 234 and the fourth plurality of wrapper cells of the second set of output wrapper chains 232 are configured to receive and store the second test response data $TRD_2$ therein.

The second test response data $TRD_2$ is then serially shifted out of the second plurality of scan cells of the second set of scan chains 234 and the fourth plurality of wrapper cells of the second set of output wrapper chains 232 for providing to the fourth compressor circuit 238. The fourth compressor circuit 238 is configured to receive the serially shifted second test response data $TRD_2$ from the second set of scan chains 234 and the second set of output wrapper chains 232 and compress the received second test response data $TRD_2$ to generate third output test data $OD_3$. In other words, the third output test data $OD_3$ is generated based on the second test response data $TRD_2$. The fourth compressor circuit 238 is further configured to provide the generated third output test data $OD_3$ to be captured at the third set of output channels 242 for testing the logic of the first inter-partition circuit 112.

The third output test data $OD_3$ may be captured by the automatic test pattern generator, which compares the captured third output test data $OD_3$ with third predefined data (i.e., an expected output of the first inter-partition circuit 112). The third predefined data may be stored in the memory of the automatic test pattern generator. A match of the third output test data $OD_3$ with the third predefined data indicates that the interconnection between the first and second partitions 102 and 104 (i.e., the first inter-partition circuit 112) is free of any defect. However, a mismatch between the third output test data $OD_3$ and the third predefined data indicates that the interconnection between the first and second partitions 102 and 104 (i.e., the first inter-partition circuit 112) has one or more defects affecting the operations of the first inter-partition circuit 112.

It will be apparent to a person of ordinary skill in the art that multiple partitions in the SoC 100 may operate in the EXTEST mode simultaneously depending upon the availability of the input pins 118 and the output pins 120. Further, while the first set of partitions (e.g., the first through third partitions 102-106) in the SoC 100 operate in the EXTEST mode, the second set partitions (e.g., the fourth and fifth partitions 108 and 110) in the SoC 100 may operate in the INTEST mode depending upon the availability of the input pins 118 and the output pins 120.

For the sake of brevity, the INTEST mode is described with regards to the testing of the core logic of the first partition 102. It will be apparent to a person of ordinary skill in the art that the core logic of the second partition 104 is also tested in a similar manner as described for the first partition 102.

During the INTEST mode, the first X-bounding logic circuit 302, the third decompressor circuit 214, the second set of selection circuits 224, the third compressor circuit 216, the first set of scan chains 213, the first set of output wrapper chains 212, and the first set of output channels 220 are active. The second set of input channels 226 and the first decompressor circuit 202 are inactive.

The automatic test pattern generator is further configured to generate fourth input test data $TD_4$ (i.e., a fourth test pattern) and provide the fourth input test data $TD_4$ to the first set of input channels 218. In an embodiment, the fourth input test data $TD_4$ corresponds to compressed test stimuli retrieved by the automatic test pattern generator from the corresponding memory. The first set of input channels 218 is configured to provide the received fourth input test data $TD_4$ at the input of the third decompressor circuit 214. The third decompressor circuit 214 is configured to receive the fourth input test data $TD_4$ and decompress the fourth input test data $TD_4$ to generate fifth intermediate data $ID_5$. The third decompressor circuit 214 is further configured to provide the generated fifth intermediate data $ID_5$ to the first X-bounding logic circuit 302 and the first set of scan chains 213. The third decompressor circuit 214 is further configured to provide the generated fifth intermediate data $ID_5$ to the first set of output wrapper chains 212 via the second set of selection circuits 224. During the INTEST mode, the second set of selection circuits 224 receive the extest mode enable signal Ext_En the inactive state. Based on the inactive state of the extest mode enable signal Ext_En, the second set of selection circuits 224 is configured to provide the fifth intermediate data $ID_5$ received from the third decompressor circuit 214 to the first set of output wrapper chains 212.

During the INTEST mode, the first X-bounding logic circuit 302 isolates the first set of scan chains 213 from any functional or unknown input received at the input boundary of the first partition 102 and the first set of output wrapper chains 212 masks any functional output of the first set of scan chains 213. The first set of output wrapper chains 212 and the first set of scan chains 213 are configured to receive and store the fifth intermediate data $ID_5$.

The stored fifth intermediate data $ID_5$ is then shifted out of the first set of scan chains 213 and the first set of output wrapper chains 212 for providing to the third compressor circuit 216. The third compressor circuit 216 is configured to compress the received fifth intermediate data $ID_5$ to generate fourth output test data $OD_4$. The third compressor circuit 216 is further configured to provide the fourth output test data $OD_4$ to be captured at the first set of output channels 220 for testing the core logic implemented by the first set of scan chains 213.

The fourth output test data $OD_4$ may be captured by the automatic test pattern generator, which compares the captured fourth output test data $OD_4$ with fourth predefined data (i.e., an expected output of the first partition 102). The fourth predefined data may be stored in the memory of the automatic test pattern generator. A match of the fourth output test data $OD_4$ with the fourth predefined data indicates that the core logic of the first partition 102 is free of any defect. However, a mismatch between the fourth output test data $OD_4$ and the fourth predefined data indicates that the core logic of the first partition 102 has one or more defects affecting the operations of the first partition 102.

Figure 4:
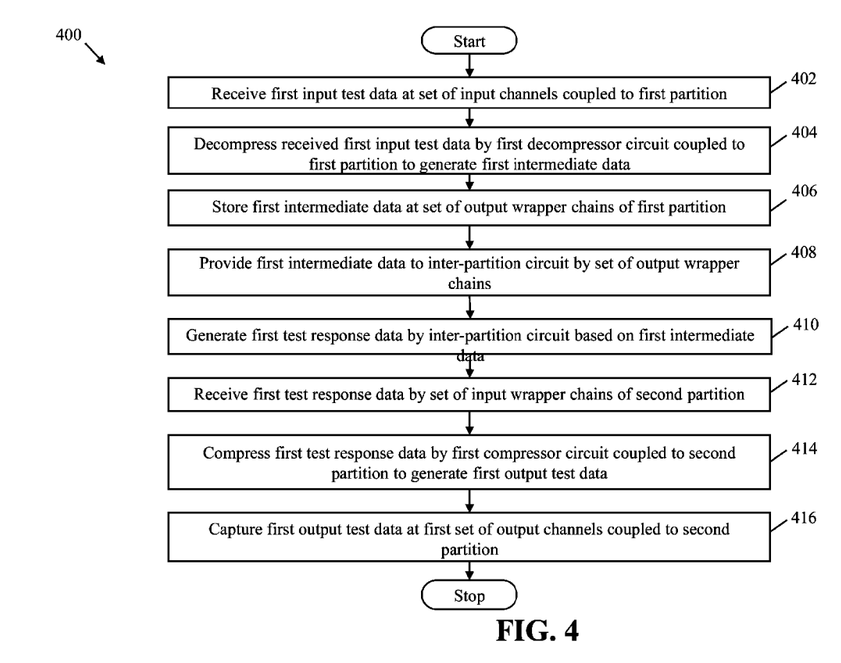
FIG. 4 is a flow chart that illustrates a method for testing at least a portion of the SoC in an external test (EXTEST) mode, in accordance with an exemplary embodiment of the disclosure.

FIG. 4 is a flow chart 400 that illustrates a method for testing at least a portion of the SoC 100 in the EXTEST mode, in accordance with an exemplary embodiment of the disclosure. For the sake of brevity, the flow chart 400 has been described with regards to the SoC 100 having the scan wrapper architecture of FIG. 2.

At step 402, the first input test data $TD_1$ is received at the second set of input channels 226 coupled to the first partition 102. At step 404, the received first input test data $TD_1$ is decompressed by the first decompressor circuit 202 coupled to the first partition 102. The first decompressor circuit 202 is configured to decompress the first input test data $TD_1$ to generate the first intermediate data $ID_1$.

At step 406, the first intermediate data $ID_1$ is stored at the first set of output wrapper chains 212 of the first partition 102. The first set of output wrapper chains 212 is configured to receive the first intermediate data $ID_1$ from the first decompressor circuit 202 by way of the second set of selection circuits 224 and store therein the first intermediate data $ID_1$. Storing the first intermediate data $ID_1$ in the first set of output wrapper chains 212 includes serially shifting the first intermediate data $ID_1$ into the second plurality of wrapper cells of the first set of output wrapper chains 212.

At step 408, the first intermediate data $ID_1$ is provided to the first inter-partition circuit 112 by the first set of output wrapper chains 212. The first inter-partition circuit 112 is configured to receive the first intermediate data $ID_1$ from the first set of output wrapper chains 212.

At step 410, the first test response data $TRD_1$ is generated by the first inter-partition circuit 112 based on the first intermediate data $ID_1$. The first inter-partition circuit 112 is configured to generate the first test response data $TRD_1$ based on the first intermediate data $ID_1$.

At step 412, the first test response data $TRD_1$ is received by the second set of input wrapper chains 230 of the second partition 104. The second set of input wrapper chains 230 is configured to receive the first test response data $TRD_1$ from the first inter-partition circuit 112.

At step 414, the first test response data $TRD_1$ is compressed to generate the first output test data $OD_1$ by the second compressor circuit 208 coupled to the second partition 104. The second compressor circuit 208 is configured to receive the first test response data $TRD_1$ from the second set of input wrapper chains 230 and compress the first test response data $TRD_1$ to generate the first output test data $OD_1$. Providing the first test response data $TRD_1$ to the second compressor circuit 208 includes serially shifting the first test response data $TRD_1$ out of the third plurality of wrapper cells of the second set of input wrapper chains 230.

At step 416, the first output test data $OD_1$ is captured at the fourth set of output channels 248 coupled to the second partition 104. In other words, the second set of input wrapper chains 230 is configured to provide the first test response data $TRD_1$ to be captured as the first output test data $OD_1$ at the fourth set of output channels 248 to test the first inter-partition circuit 112.

Figure 5:
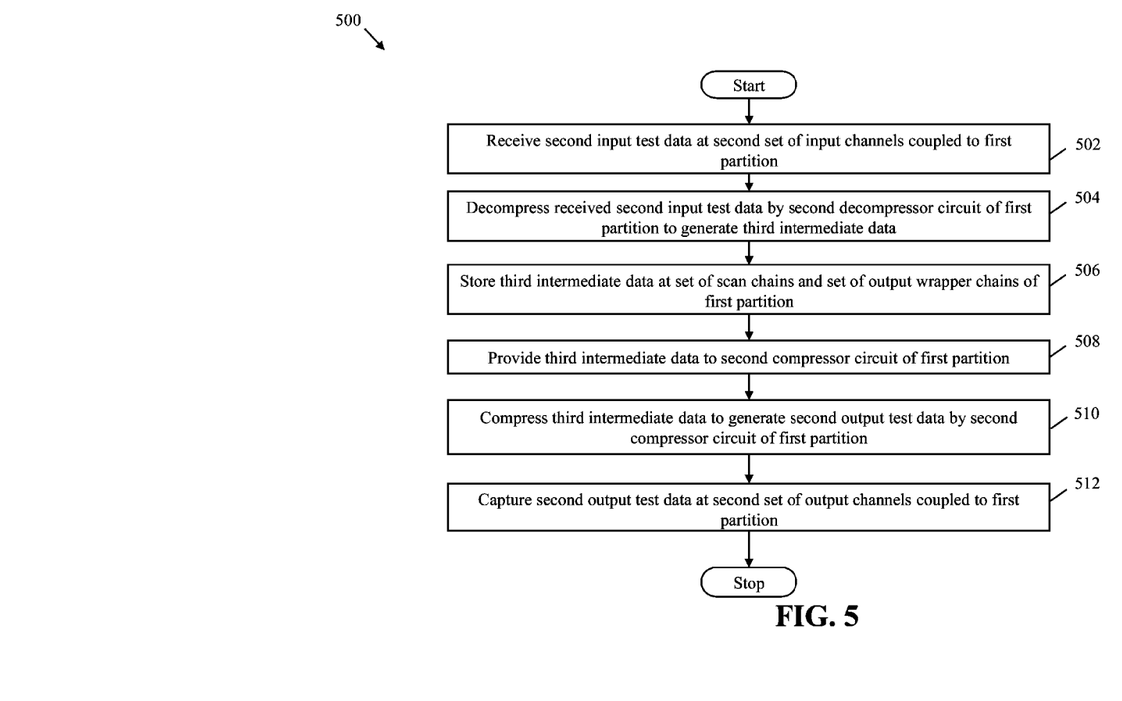
FIG. 5 is a flowchart that illustrates a method for testing at least a portion of the SoC in an internal test (INTEST) mode, in accordance with an exemplary embodiment of the disclosure.

FIG. 5 is a flow chart 500 that illustrates a method for testing at least a portion of the SoC 100 in the INTEST mode, in accordance with an exemplary embodiment of the disclosure. For the sake of brevity, the flow chart 500 has been described with regards to the SoC 100 having the scan wrapper architecture of FIG. 2.

At step 502, the second input test data $TD_2$ is received at the first set of input channels 218 coupled to the first partition 102. The first set of input channels 218 is configured to receive the second input test data $TD_2$.

At step 504, the received second input test data $TD_2$ is decompressed by the third decompressor circuit 214 of the first partition 102. The third decompressor circuit 214 is configured to decompress the second input test data $TD_2$ to generate the third intermediate data $ID_3$.

At step 506, the third intermediate data $ID_3$ is stored at the first set of scan chains 213 and the first set of output wrapper chains 212 of the first partition 102. The first set of scan chains 213 and the first set of output wrapper chains 212 are configured to receive and store the third intermediate data $ID_3$. The third intermediate data $ID_3$ is further received and stored by the first set of input wrapper chains 210.

At step 508, the third intermediate data $ID_3$ is provided to the third compressor circuit 216. The third compressor circuit 216 is configured to receive the third intermediate data $ID_3$ from the first set of scan chains 213, the first set of output wrapper chains 212, and the first set of input wrapper chains 210.

At step 510, the third intermediate data $ID_3$ is compressed by the third compressor circuit 216 of the first partition 102. The third compressor circuit 216 is configured to compress the third intermediate data $ID_3$ to generate the second output test data $OD_2$.

At step 512, the second output test data $OD_2$ is captured at the second set of output channels 228 coupled to the first partition 102. The third compressor circuit 216 is configured to provide the second output test data $OD_2$ to be captured at the second set of output channels 228 to test the first set of scan chains 213 implementing the core logic of the first partition 102. In other words, the first set of scan chains 213, the first set of output wrapper chains 212, and the first set of input wrapper chains 210 provide the third intermediate data $ID_3$ to be captured as the second output test data $OD_2$ at the second set of output channels 228.

As compared to conventional scan architectures, the SoC 100 having the scan wrapper architectures of any of FIGS. 2 and 3 provides an optimal means to reduce input/output pin requirement during testing in the EXTEST mode. The reduction in the pin requirement during the EXTEST mode allows for optimal assignment of input/output pins for testing additional partitions in the EXTEST or INTEST mode, thereby achieving higher test bandwidth. Since additional number of partitions could be tested in each test run, a desired test coverage and test pattern count could be achieved for the SoC 100 of the present disclosure in significantly lesser test-combinations, time, and cost as compared to the conventional scan architectures.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

What is claimed is:

1. A system-on-chip (SoC), comprising:
   a first set of input channels;
   a first partition comprising a first set of output wrapper chains coupled to the first set of input channels;
   a first set of output channels;
   a second partition comprising a set of input wrapper chains coupled to the first set of output channels; and
   an inter-partition circuit coupled between the first partition and the second partition, wherein in an external test (EXTEST) mode of the SoC:
      the first set of input channels is configured to receive first input test data,
      the first set of output wrapper chains is configured to receive and store first intermediate data, wherein the first intermediate data is generated based on the first input test data, and wherein the first intermediate data stored by the first set of output wrapper chains remains unobserved,
      the inter-partition circuit is configured to receive the first intermediate data from the first set of output wrapper chains and generate test response data based on the first intermediate data, and
      the set of input wrapper chains is configured to receive the test response data, and provide the test response data to be captured as first output test data at the first set of output channels to test the inter-partition circuit.

2. The SoC of claim 1, wherein each of the first set of output wrapper chains include a first plurality of wrapper cells coupled in a series arrangement such that the first intermediate data is serially shifted into the first plurality of wrapper cells.

3. The SoC of claim 1, further comprising:
   a first compressor circuit coupled to the set of input wrapper chains and the first set of output channels, wherein in the EXTEST mode, the first compressor circuit is configured to receive the test response data from the set of input wrapper chains, compress the received test response data to generate the first output test data, and provide the first output test data to be captured at the first set of output channels.

4. The SoC of claim 3, wherein each of the set of input wrapper chains include a second plurality of wrapper cells coupled in a series arrangement, and wherein the test response data is serially shifted out of the second plurality of wrapper cells to provide to the first compressor circuit.

5. The SoC of claim 3, wherein the second partition further comprises a first set of selection circuits that is coupled to the set of input wrapper chains and the first compressor circuit, and configured to receive an extest mode enable signal.

6. The SoC of claim 5, wherein in the EXTEST mode, the extest mode enable signal is active, and the first set of selection circuits is configured to receive the test response data from the set of input wrapper chains and provide the test response data to the first compressor circuit.

7. The SoC of claim 1, further comprising:
   a first decompressor circuit coupled to the first set of output wrapper chains and the first set of input channels, wherein in the EXTEST mode, the first decompressor circuit is configured to receive the first input test data from the first set of input channels, decompress the first input test data to generate the first intermediate data, and provide the first intermediate data to the first set of output wrapper chains.

8. The SoC of claim 7, further comprising:
   a second set of input channels; and
   a second set of output channels such that the first partition is coupled to the second set of input channels and the second set of output channels.

9. The SoC of claim 8, wherein the first partition further comprises:
   a second decompressor circuit coupled to the second set of input channels;
   a second compressor circuit coupled to the second set of output channels; and
   a set of scan chains, wherein the set of scan chains and the first set of output wrapper chains are coupled in a parallel arrangement between the second decompressor circuit and the second compressor circuit, wherein in an internal test (INTEST) mode of the SoC:
      the second set of input channels is configured to receive second input test data,
      the second decompressor circuit is configured to decompress the second input test data to generate second intermediate data,
      the set of scan chains and the first set of output wrapper chains are configured to receive and store the second intermediate data, and
      the second compressor circuit is configured to receive the second intermediate data from the set of scan chains and the first set of output wrapper chains, compress the second intermediate data to generate second output test data, and provide the second output test data to be captured at the second set of output channels to test the set of scan chains.

10. The SoC of claim 9, wherein the first partition further comprises a second set of selection circuits coupled to the first set of output wrapper chains, and the first and second decompressor circuits, and configured to receive an extest mode enable signal.

11. The SoC of claim 10, wherein in the EXTEST mode, the extest mode enable signal is active, and the second set of selection circuits is configured to receive the first intermediate data from the first decompressor circuit and provide the first intermediate data to the first set of output wrapper chains based on the extest mode enable signal.

12. The SoC of claim 10, wherein in the INTEST mode, the extest mode enable signal is inactive, and the second set of selection circuits is configured to receive the second intermediate data from the second decompressor circuit and provide the second intermediate data to the first set of output wrapper chains based on the extest mode enable signal.

13. The SoC of claim 7, further comprising:
a third decompressor circuit that shares the first set of input channels with the first decompressor circuit, and is configured to receive the first input test data and decompress the first input test data to generate third intermediate data, wherein the second partition further comprises a second set of output wrapper chains that is coupled to the third decompressor circuit and configured to receive the third intermediate data, and wherein the second set of output wrapper chains is separated from the set of input wrapper chains.

14. A method for testing a system-on-chip (SoC), wherein the SoC includes at least first and second partitions coupled by way of an inter-partition circuit, the method comprising:
operating the SoC in an external test (EXTEST) mode, wherein operating the SoC in the EXTEST mode comprises:
receiving first input test data at a first set of input channels coupled to the first partition;
storing first intermediate data in a set of output wrapper chains of the first partition, wherein the first intermediate data is generated based on the first input test data, and wherein the first intermediate data stored in the set of output wrapper chains of the first partition remains unobserved;
providing the first intermediate data to the inter-partition circuit by the set of output wrapper chains;
receiving test response data by a set of input wrapper chains of the second partition from the inter-partition circuit, wherein the test response data is generated based on the first intermediate data; and
capturing first output test data at a first set of output channels coupled to the set of input wrapper chains, wherein the first output test data is generated based on the test response data, and wherein the inter-partition circuit is tested based on a comparison of the captured first output test data with first predefined data.

15. The method of claim 14, wherein storing the first intermediate data in the set of output wrapper chains comprises, serially shifting the first intermediate data into a first plurality of wrapper cells included in each of the set of output wrapper chains.

16. The method of claim 14, wherein capturing the first output test data at the first set of output channels comprises, serially shifting the test response data out of a second plurality of wrapper cells included in each of the set of input wrapper chains at the first set of output channels.

17. The method of claim 14, further comprising operating the SoC in an internal test (INTEST) mode, wherein operating the SoC in the INTEST mode comprises:
receiving second input test data at a second set of input channels coupled to the first partition;
decompressing the received second input test data to generate second intermediate data by a decompressor circuit of the first partition;
storing the second intermediate data in a set of scan chains and the set of output wrapper chains of the first partition;
providing the second intermediate data to a compressor circuit of the first partition;
compressing the second intermediate data to generate second output test data by the compressor circuit; and
capturing the second output test data at a second set of output channels coupled to the first partition, wherein the set of scan chains is tested based on a comparison of the captured second output test data with second predefined data.

18. A system-on-chip (SoC), comprising:
a first set of input channels;
a first partition comprising a first set of output wrapper chains coupled to the first set of input channels;
a first set of output channels;
a second partition comprising a first set of scan chains and a second set of output wrapper chains coupled to the first set of output channels; and
an inter-partition circuit coupled between the first partition and the second partition, wherein in an external test (EXTEST) mode of the SoC:
the first set of input channels is configured to receive first input test data,
the first set of output wrapper chains is configured to receive and store first intermediate data, wherein the first intermediate data is generated based on the first input test data, and wherein the first intermediate data stored by the first set of output wrapper chains remains unobserved,
the inter-partition circuit is configured to receive the first intermediate data from the first set of output wrapper chains and generate test response data based on the first intermediate data, and
the first set of scan chains and the second set of output wrapper chains are configured to receive the test response data, and provide the test response data to be captured as first output test data at the first set of output channels to test the inter-partition circuit.

19. The SoC of claim 18, wherein the second partition further comprises an x-bounding logic circuit that is coupled to the inter-partition circuit and the first set of scan chains, wherein in the EXTEST mode, the x-bounding logic circuit is configured to receive the test response data from the inter-partition circuit and provide the received test response data to the first set of scan chains and the second set of output wrapper chains.

20. The SoC of claim 19, further comprising:
a second set of input channels;
a second set of output channels such that the first partition is coupled to the second set of input channels and the second set of output channels, wherein the first partition further comprises:
a decompressor circuit coupled to the second set of input channels;
a compressor circuit coupled to the second set of output channels; and
a second set of scan chains, wherein the second set of scan chains and the first set of output wrapper chains are coupled in a parallel arrangement between the decompressor circuit and the compressor circuit, wherein in an internal test (INTEST) mode of the SoC:
the second set of input channels is configured to receive second input test data, the decompressor circuit is configured to decompress the second input test data to generate second intermediate data,
the second set of scan chains and the first set of output wrapper chains are configured to receive and store the second intermediate data, and
the compressor circuit is configured to receive the second intermediate data from the second set of scan chains and the first set of output wrapper chains, compress the second intermediate data to generate second output test data, and provide the second output test data to be captured at the second set of output channels to test the second set of scan chains.

* * * * *